(12) United States Patent
Kim

(10) Patent No.: US 9,156,134 B2
(45) Date of Patent: Oct. 13, 2015

(54) METHOD FOR PREPARING AN ABRASIVE SHEET USING AN EMBOSSED SUBSTRATE

(75) Inventor: Nam Il Kim, Suwon-si (KR)

(73) Assignee: SUN ABRASIVES CORPORATION, Ansan (KR)

( * ) Notice: Subject to any disclaimer, the term of this patent is extended or adjusted under 35 U.S.C. 154(b) by 291 days.

(21) Appl. No.: 13/122,989

(22) PCT Filed: Aug. 19, 2009

(86) PCT No.: PCT/KR2009/004613
§ 371 (c)(1),
(2), (4) Date: Apr. 7, 2011

(87) PCT Pub. No.: WO2010/041815
PCT Pub. Date: Apr. 15, 2010

(65) Prior Publication Data
US 2011/0217520 A1 Sep. 8, 2011

(30) Foreign Application Priority Data
Oct. 8, 2008 (KR) .......................... 10-2008-0098452

(51) Int. Cl.
*B32B 38/10* (2006.01)
*B32B 37/02* (2006.01)
(Continued)

(52) U.S. Cl.
CPC .............. *B24D 11/001* (2013.01); *B32B 37/12* (2013.01); *B32B 38/10* (2013.01); *B41M 5/52* (2013.01);
(Continued)

(58) Field of Classification Search
CPC .... B24D 11/005; B24D 11/008; B24D 11/02; B24D 11/001; G09F 3/10; B32B 27/00; B32B 38/10; B32B 37/12; H01L 21/6835; B29C 2049/2427; B29C 2049/2416; B29C 63/0013; B29C 65/48; B65H 2301/5126; B41M 5/52; B41M 5/5254; B44C 1/1712
USPC .................................. 156/153, 154, 230–249
See application file for complete search history.

(56) References Cited

U.S. PATENT DOCUMENTS 3,444,732 A * 5/1969 McKinley et al. .......... 73/150 A
6,217,432 B1 * 4/2001 Woo .............................. 451/534
(Continued)

FOREIGN PATENT DOCUMENTS

JP  2000-061817 A    2/2000
JP   2000061817 A *  2/2000
(Continued)

OTHER PUBLICATIONS

English translation of JP2005-074614; Boku et al. Mar. 24, 2005.*
(Continued)

*Primary Examiner* — Sonya Mazumdar
(74) *Attorney, Agent, or Firm* — Sughrue Mion, PLLC

(57) ABSTRACT

An abrasive sheet having improved properties which enable precise polishing and finishing is prepared by (1) coating an abrasive material-containing slurry on a concave face of an embossed first substrate and then UV-curing or pre-drying with heat the coating layer to form an abrasive material coating layer on the embossed first substrate; (2) coating an adhesive on one side of a second substrate to form an adhesive layer thereon; (3) combining the first and second substrates such that the abrasive material coating layer is bonded to the adhesive layer to form a laminate; and (4) separating the first substrate from the laminate formed in step (3), to obtain an abrasive sheet having an embossed abrasive material coating layer.

15 Claims, 2 Drawing Sheets

(51) Int. Cl.
  B32B 37/14   (2006.01)
  B29C 65/48   (2006.01)
  B44C 1/17    (2006.01)
  B24D 11/00   (2006.01)
  C08J 5/14    (2006.01)
  B41M 5/52    (2006.01)
  B32B 37/12   (2006.01)
  *G09F 3/10*      (2006.01)
  B32B 37/24   (2006.01)
  *H01L 21/683*    (2006.01)

(52) U.S. Cl.
  CPC ............... *B29C 65/48* (2013.01); *B44C 1/1712* (2013.01); *H01L 21/6835* (2013.01); *Y10T 428/24612* (2015.01)

(56) References Cited

U.S. PATENT DOCUMENTS

| | | | | |
|---|---|---|---|---|
| 7,824,516 | B2* | 11/2010 | Amos et al. | 156/247 |
| 2003/0143938 | A1* | 7/2003 | Braunschweig et al. | 451/533 |
| 2006/0283539 | A1* | 12/2006 | Slafer | 156/230 |
| 2011/0277922 | A1* | 11/2011 | Masuda et al. | 156/232 |

FOREIGN PATENT DOCUMENTS

| | | |
|---|---|---|
| JP | 2005-074614 A | 3/2005 |
| KR | 20-0363533 Y1 | 10/2004 |

OTHER PUBLICATIONS

English translation of JP2000-061817; Feb. 29, 2000.*

* cited by examiner

METHOD FOR PREPARING AN ABRASIVE SHEET USING AN EMBOSSED SUBSTRATE

FIELD OF THE INVENTION

The present invention relates to a method for preparing an abrasive sheet having properties suitable for precise polishing and finishing using an embossed substrate.

BACKGROUND OF THE INVENTION

A conventional abrasive sheet is generally prepared by coating a first adhesive (a make-coat adhesive) on one side of a substrate such as a cloth, paper, and film; electrostatic-coating an abrasive material thereon, followed by pre-curing; coating a second adhesive (a size-coat adhesive) thereon, followed by pre-curing; winding the resulting laminate; and subjecting the jumbo roll-type product to final curing. A cross-sectional view of a conventional abrasive sheet thus prepared is shown in FIG. 1.

However, the use in such a process of an abrasive material having a particle size of #2000 or less (10 µm or less) is difficult due to its inconsistent behavior during the electrostatic- or gravity-coating, especially under a high humid condition.

In addition, an abrasive sheet comprising a micro-sized and fine abrasive material tends to generate frequent scratches on the work piece during a polishing operation and also forms a water membrane thereon when applied to wet polishing, which causes insufficient polishing. Therefore, an embossed abrasive sheet is preferred: An embossed-type abrasive sheet comprising a micro-sized abrasive material does not suffer from the above-mentioned problems due to the presence of grooves. Generally, the embossing of a particular dimension enhances the grinding speed and surface roughness ($R_a$ and $R_{max}$ values) of the work piece, and therefore, it is important to control the size and shape of the embossing pattern.

SUMMARY OF THE INVENTION

Accordingly, it is an object of the present invention to provide a simple and economic method for preparing an abrasive sheet having improved properties which enable precise polishing and finishing without causing the generation of scratches.

In accordance with one aspect of the present invention, there is provided a method for preparing an abrasive sheet which comprises:

(1) coating an abrasive material-containing slurry on a concave face of an embossed first substrate and then UV-curing or pre-drying with heat the coating layer to form an abrasive material coating layer on the embossed first substrate;

(2) coating an adhesive on one side of a second substrate to form an adhesive layer thereon;

(3) combining the first and second substrates such that the abrasive material coating layer formed in step (1) is bonded to the adhesive layer formed in step (2) to form a laminate; and (4) separating the first substrate from the laminate formed in step (3), to obtain an abrasive sheet having an embossed abrasive material coating layer, said abrasive sheet being optionally cured thereafter.

BRIEF DESCRIPTION OF THE DRAWINGS

The above and other objects and features of the present invention will become apparent from the following description of the invention, when taken in conjunction with the accompanying drawings, which respectively show.

DESCRIPTION ON DRAWING SYMBOLS

①: resin layer for release
②: low-density polyethylene (LDPE) resin layer
③: paper or film
④: abrasive material-containing slurry
⑤: adhesive layer
⑥: second substrate (porous sponge)

DETAILED DESCRIPTION OF THE INVENTION

Figure 1:
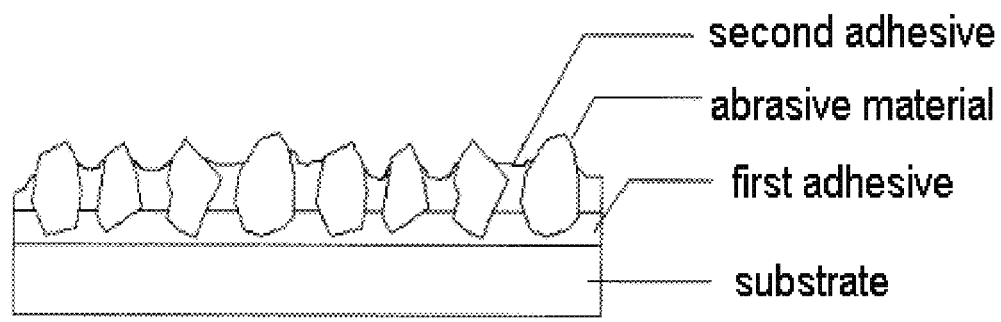
FIG. 1: a cross-sectional view of a conventional abrasive sheet.
Figure 2:
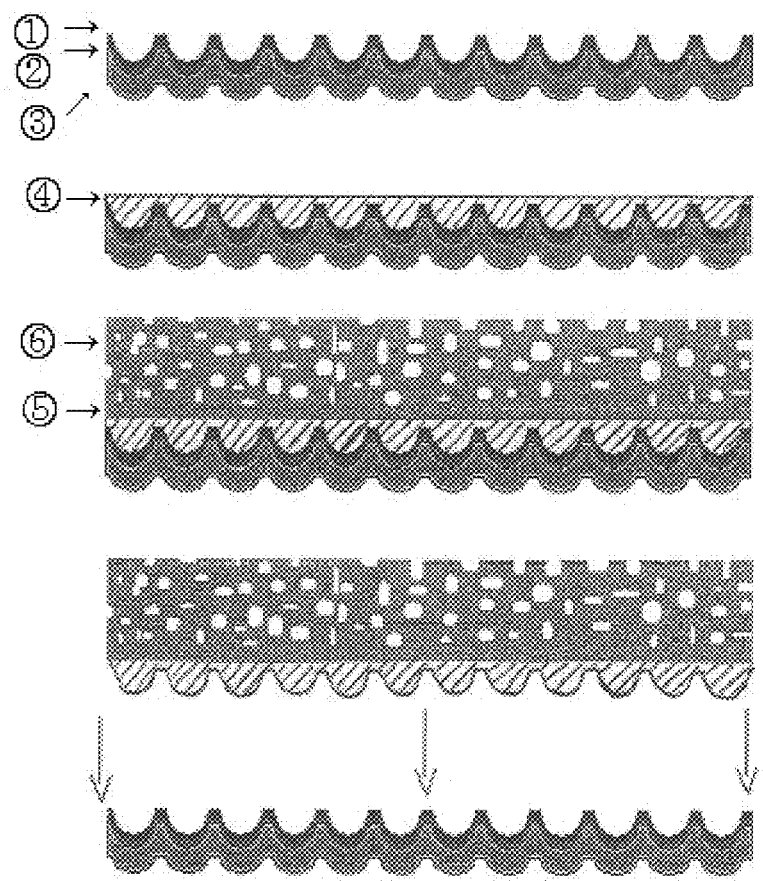
FIG. 2: a schematic diagram showing a series of processes to prepare the abrasive sheet in accordance with the present invention.

The abrasive sheet according to the present invention is prepared by a series of a process comprising: (1) coating an abrasive material-containing slurry on a concave face of an embossed first substrate and then UV-curing or pre-drying with heat the coating layer to form an abrasive material coating layer on the embossed first substrate; (2) coating an adhesive on one side of a second substrate to form an adhesive layer thereon; (3) combining the first and second substrates such that the abrasive material coating layer formed in step (1) is bonded to the adhesive layer formed in step (2) to form a laminate thereof; and (4) separating the first substrate from the laminate formed in step (3), to obtain an abrasive sheet having an embossed abrasive material coating layer, said abrasive sheet being optionally cured thereafter. Such an inventive process to prepare an abrasive sheet is shown in FIG. 2.

The embossed first substrate employed in the present invention may be obtained by coating a resin for release on the concave face of a paper, a polyethylene terephthalate film, a polypropylene film, or a polyethylene film which has at least one embossing shape. The embossing shape may be the form of a cone, a triangular pyramid, a quadrangular pyramid, a hemi-cone, a dome, a serge, or a combination thereof, and have a dimension of an inner diameter and a height of 50~1,000 µm and 100~500 µm, respectively. The form and dimension of the embossing shape may depend on the particle size of an abrasive material used. The resin for release may be any one of conventional ones and be used in a conventional coating amount. Prior to formation of the resin layer for release, for the purpose of more convenient separation of the first substrate, a low-density polyethylene (LDPE) resin layer may be formed on the embossed paper or film.

The abrasive material-containing slurry employed in the present invention is a conventional abrasive material slurry which comprises an abrasive material and an adhesive as essential components, and may have a viscosity at room temperature (25±2° C.) of 500 to 10,000 cps and a solid content of 40 to 85% by weight. If necessary, the abrasive material-containing slurry may comprise conventional additives such as a thickening agent, calcium carbonate, a fluorinated compound, a dispersant and a coupling agent. Particles of alumina ($Al_2O_3$), silicon carbide (SiC), silica ($SiO_2$), ceramics (sol-gel), ceria ($CeO_3$), Garnet and a mixture thereof having a particle size of 0.5 to 150 µm are preferred as the abrasive material. Suitable for the adhesive present in the abrasive material-containing slurry is a phenol resin, a urea melamine resin, a urethane resin, an epoxy resin, a polyester acrylate resin, a latex, a water-soluble protein-based adhesive, or a mixture thereof.

The amount of the abrasive material-containing slurry used in step (1) in coating the concave face of the embossed first substrate may be in the range of 25 to 130 g/m$^2$. The pre-drying of the coating layer may be conducted by heat-treating at 100 to 120° C. for 1 to 5 mins.

The second substrate employed in the present invention may be a cloth, paper, a film, a porous sponge, a loop fabric, a non-woven fabric, an aluminum foil, or a combination thereof. Suitable for the adhesive coated on the second substrate is a polyurethane resin, an epoxy resin, or a synthetic rubber such as an acrylonitrile-butadiene-rubber (NBR) latex, a styrene-butadiene-rubber (SBR) latex, a chloroprene-rubber (CR) latex, neoprene and self-cross-linking PSA (pressure sensitive adhesive) acryl rubber. The adhesive may have a viscosity at room temperature (25±2° C.) of 500 to 10,000 cps and, if necessary, a cross-linking agent may be used together with the adhesive.

The amount of the adhesive used in coating one side of the second substrate may be in the range of 20 to 60 g/m$^2$.

Figure 3:
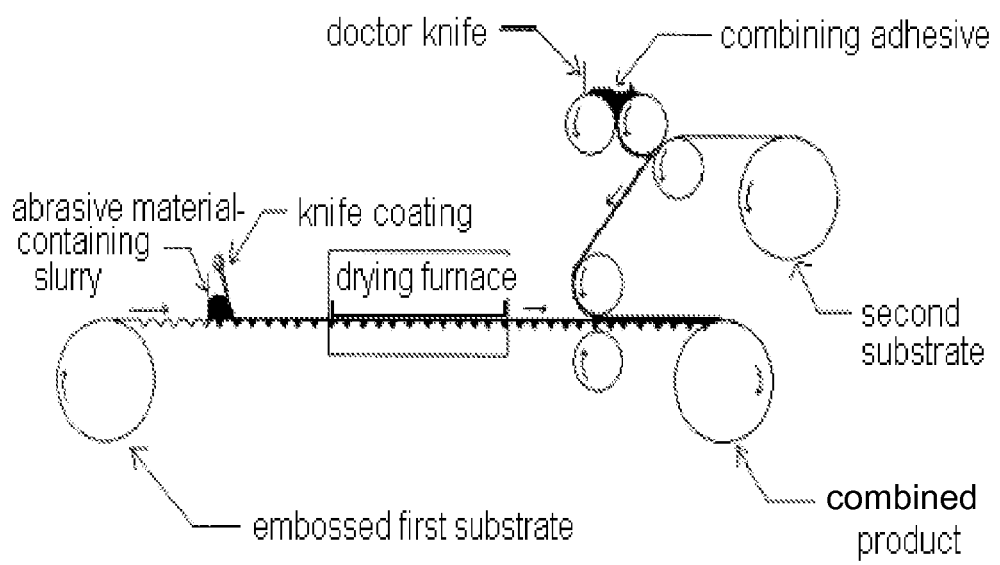
FIGS. 3 and 4: schematic diagrams showing a process to combine first and second substrates, and a process to separate the first substrate from the laminate formed therein, respectively, in accordance with the inventive method.
Figure 4:
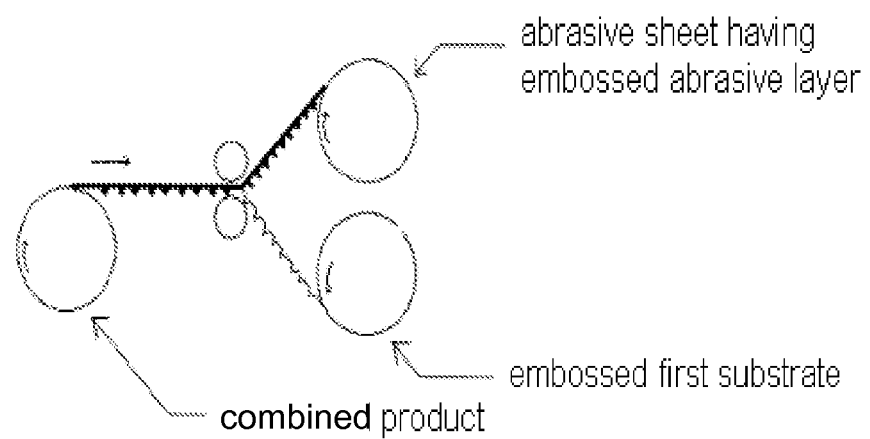

The first and second substrates are allowed to be combined such that the abrasive material coating layer is bonded to the adhesive layer, forming a laminate. If necessary, the combination of the first and second substrates may be conducted by passing them through at least one compression roller while allowing the abrasive material coating and adhesive layers to face to each other. The pressure of the compression roller may be in the range of 1.0 to 3.0 kgf/cm$^2$. The laminate which comes out of the compression roller is wound and kept at room temperature (25±2° C.) for a period of 1 to 5 days. The first substrate is separated from the laminate to obtain an abrasive sheet having an embossed abrasive material coating layer. The abrasive sheet is wound and finally cured by heat-treatment at 110 to 130° C. for 60 to 180 mins or by UV-treatment. If the adhesive present in the abrasive material-containing slurry is a single UV-curable resin, the above-mentioned final curing is not necessary. A combination process of the first and second substrates, and a separation process of the first substrate from the laminate according to the inventive method are shown in FIGS. 3 and 4, respectively.

In accordance with the present invention, an abrasive sheet of a laminated form which comprises a second substrate, an adhesive layer and an embossed abrasive material coating layer having various three-dimensional structures may be prepared by the above method. The inventive abrasive sheet, in particular, one comprising extra-micro abrasive material particles having a size of 20 μm or less, provides an improved cutting performance without causing the generation of scratches, and, therefore, it can be advantageously employed in precise polishing and finishing.

The following Examples and Comparative Examples are given for the purpose of illustration only, and are not intended to limit the scope of the invention.

Example 1

9.92% by weight of styrene-butadiene-rubber (SBR) latex KSL 103 (48%, Kumhosukwha), 20.11% by weight of Resole phenol resin HP-60 (71%, Taeyang Chemical Co., Ltd.), 0.47% by weight of yellow dye GOZ 01 (43%, Woosung Chemicals), 20.65% by weight of water, 0.29% by weight of dispersant Solvaron D-80 (70%, Osung Chemicals), 0.68% by weight of Attagel-50 (100%, Engelhard), and 47.87% by weight of white particulate Al$_2$O$_3$ #2,000 (100%, Treibacher) were blended with a mixer for 3 hrs, to obtain an abrasive material-containing slurry having a viscosity (at 25° C.) of 1,200 to 1,300 cps. The abrasive material-containing slurry thus prepared was knife-coated on the concave face of embossed release paper HL Tango AW118 (Arjowiggins casting paper limited) in an amount of 26 g/m$^2$, which was pre-dried at 100 to 120° C. for 2 mins, to obtain a release paper (a first substrate) having an abrasive material coating layer.

On the other hand, 100 parts by weight of polyurethane MG 404 (58%, Mirae Materials) and 23.0 parts by weight of cross-linking agent MG 35B (78%, Mirae Materials) were mixed to prepare an adhesive having a viscosity (at 25° C.) of 2,000 cps, which was coated on one side of a 3 mm-thick porous sponge in an amount of 105 g/m$^2$, to obtain a sponge (a second substrate) having an adhesive layer.

Then, the first and second substrates were put through two compression rollers under a pressure of 1.5 kgf/cm$^2$ in such a manner that the abrasive material coating layer was bonded to the adhesive layer, forming a laminate thereof. The laminate was wound and kept at room temperature (25±2° C.) for 2 days (see FIG. 3). The first substrate was then separated from the resulting laminate (see FIG. 4), which was wound and heat-cured at 120° C. for 60 mins, to obtain an abrasive sheet.

Example 2

11.67% by weight of SBR latex KSL 103 (48%, Kumhosukwha), 4.0% by weight of epoxy resin LER 850 (100%, Hexion), 3.43% by weight of curing agent LA6022 (100%, Hexion), 1.12% by weight of yellow dye GOZ 01 (43%, Woosung Chemicals), 12.11% by weight of Solvent PM (Dowanol), 0.24% by weight of surfactant Q2-5211 (100%, ICI Chemicals), 0.32% by weight of coupling agent B 515.1 (50%, BYK), 0.80% by weight of Attagel-50 (100%, Engelhard), and 66.32% by weight of white particulate Al$_2$O$_3$ #2,000 (100%, Treibacher) were blended with a mixer for 3 hrs, to obtain an abrasive material-containing slurry having a viscosity (at 25° C.) of 1,500 to 1,700 cps. Hereinafter, the procedure of Example 1 was repeated except that the abrasive material-containing slurry was knife-coated in an amount of 25 g/m$^2$, to obtain an abrasive sheet.

Example 3

13.18% by weight of urea melamine resin UM-80 (71%, Shinjin Chemicals), 11.38% by weight of SBR latex KSL 103 (48%, Kumhosukwha), 1.09% by weight of yellow dye GOZ 01 (43%, Woosung Chemicals), 11.54% by weight of water, 0.33% by weight of dispersant Solvaron D-80 (70%, Osung Chemicals), 0.78% by weight of Attagel-50 (100%, Engelhard), 61.14% by weight of white particulate Al$_2$O$_3$ #2,000 (100%, Treibacher), and 0.56% by weight of curing agent NH$_4$Cl (98%, commercially available one) were blended with a mixer for 3 hrs, to obtain an abrasive material-containing slurry having a viscosity (at 25° C.) of 1,200 to 1,300 cps. Hereinafter, the procedure of Example 1 was repeated except that the abrasive material-containing slurry was knife-coated in an amount of 29 g/m$^2$, to obtain an abrasive sheet.

Example 4

9.00% by weight of polyester acrylate EB-830 (100%, SK Saitek), 4.50% by weight of reactive diluent trimethylolpropane triacrylate (TMPTA) (100%, Ciba-Geigy AG), 0.20% by weight of photoinitiator Darocure-1173 (Ciba-Geigy AG), 0.21% by weight of photoinitiator Chivacure-TPO (Ciba-Geigy AG), 10.00% by weight of Solvent PM (Dowanol), 0.27% by weight of surfactant Q2-5211 (100%, ICI Chemicals), 0.90% by weight of Attagel-50 (100%, Engelhard), and 74.93% by weight of white particulate $Al_2O_3$ #2,000 (100%, Treibacher) were blended with a mixer for 3 hrs, to obtain an abrasive material-containing slurry having a viscosity (at 25° C.) of 1,400 to 1,500 cps. Hereinafter, the procedure of Example 1 was repeated except that the abrasive material-containing slurry was knife-coated in an amount of 27 g/m², which was completely cured while passing through a UV drier, and that no further curing was conducted, to obtain an abrasive sheet.

Example 5

18.46% by weight of polyurethane MG-600A (65%, Mirae Materials), 4.50% by weight of cross-linking agent CA-123 (40%, Mirae Materials), 10.84% by weight of Solvent PM (Dowanol), 0.24% by weight of surfactant Q2-5211 (100%, ICI Chemicals), 0.80% by weight of Attagel-50 (100%, Engelhard), and 65.16% by weight of white particulate $Al_2O_3$ #2,000 (100%, Treibacher) were blended with a mixer for 3 hrs, to obtain an abrasive material-containing slurry having a viscosity (at 25° C.) of 1,500 to 1,600 cps. Hereinafter, the procedure of Example 1 was repeated except that the abrasive material-containing slurry was knife-coated in an amount of 26 g/m², to obtain an abrasive sheet.

Example 6

2.34% by weight of urea melamine resin UM-80 (71%, Shinjin Chemicals), 20.80% by weight of purified animal hide glue CFT (45%, Sun Abrasives Corporation), 1.09% by weight of yellow dye GOZ 01 (43%, Woosung Chemicals), 9.84% by weight of water, 0.33% by weight of dispersant Solvaron D-80 (70%, Osung Chemicals), 0.78% by weight of Attagel-50 (100%, Engelhard), 64.68% by weight of white particulate $Al_2O_3$ #2,000 (100%, Treibacher), and 0.14% by weight of curing agent $NH_4Cl$ (98%, commercially available one) were blended with a mixer for 3 hrs, to obtain an abrasive material-containing slurry having a viscosity (at 25° C.) of 1,300 to 1,400 cps. Hereinafter, the procedure of Example 1 was repeated except that the abrasive material-containing slurry was knife-coated in an amount of 29 g/m², to obtain an abrasive sheet.

Comparative Example 1

Film substrate L312T #2,000 commercially available from Sun Abrasives Corporation was used.
Physical Property Test
The physical properties of the respective abrasive sheets obtained in Examples 1 to 6 and Comparative Example 1 were measured to determine a cutting performance, a work piece surface roughness, the number of use, and an end point. The results are shown in Table 1.

(i) Cutting performance: The time required for removing using a wet polishing method a black oil paint layer (width×length: 10 mm×200 mm) applied on the transparent paint surface ground with conventional abrasive sheet L312T #1,500 (abrasion apparatus: Vibrator disc sander (Wade, WA51330, pad-type 3" Velcro disc)).

(ii) Surface roughness: $R_a$ and $R_{max}$ values measured using a surface roughness tester for the work piece for the assessment of the cutting performance.

(iii) Number of use: The number of the case to achieve complete removal of a black oil paint on the assessment of the cutting performance.

(iv) End point: The phenomenon observed by naked eye when the abrasive sheet was worn out.

TABLE 1

| | Ex. 1 | Ex. 2 | Ex. 3 | Ex. 4 | Ex. 5 | Ex. 6 | Comp. Ex. 1 |
|---|---|---|---|---|---|---|---|
| Cutting performance (sec) | $1^{st}$: 40 $2^{nd}$: 47 $3^{rd}$: 57 $4^{th}$: 57 $5^{th}$: 78 | $1^{st}$: 50 $2^{nd}$: 65 $3^{rd}$: 70 $4^{th}$: 82 | $1^{st}$: 60 $2^{nd}$: 62 $3^{rd}$: 73 $4^{th}$: 85 | $1^{st}$: 45 $2^{nd}$: 45 $3^{rd}$: 56 $4^{th}$: 80 | $1^{st}$: 65 $2^{nd}$: 78 $3^{rd}$: 83 | $1^{st}$: 60 $2^{nd}$: 73 $3^{rd}$: 86 | $1^{st}$: 40 $2^{nd}$: 85 |
| Surface roughness $R_a$ value | 0.10 μm | 0.12 μm | 0.07 μm | 0.11 μm | 0.06 μm | 0.07 μm | 0.15 μm |
| Surface roughness $R_{max}$ value | 0.85 μm | 0.95 μm | 0.60 μm | 0.90 μm | 0.60 μm | 0.55 μm | 1.03 μm |
| Number of use (times) | 5 | 4 | 4 | 4 | 3 | 3 | 2 |
| End point | Abrasive material drop out | Slipped | Abrasive material drop out | Abrasive material drop out | Slipped | Abrasive material drop out | Insufficient polishing by formation of water membrane |

As can be seen from Table 1, the inventive abrasive sheets of Examples 1 to 6 exhibit improved properties in terms of cutting performance and surface roughness, as compared with the conventional abrasive sheet of Comparative Example 1.

As described above, the inventive abrasive sheet shows an improved cutting performance without causing the generation of scratches, and, therefore, it can be advantageously employed in precise polishing and finishing.

While the invention has been described with respect to the above specific embodiments, it should be recognized that various modifications and changes may be made to the invention by those skilled in the art which also fall within the scope of the invention as defined by the appended claims.

What is claimed is:

1. A method for preparing an abrasive sheet which comprises:
   (1) coating an abrasive material-containing slurry on a concave face of an embossed first substrate and then pre-drying with heat the coating layer to provide a first substrate having an abrasive material coating layer on its embossed surface;
   (2) coating an adhesive on one side of a second substrate to provide an adhesive layer coated second substrate;
   (3) combining the first substrate having the abrasive material coating layer and the adhesive layer coated second substrate such that the abrasive material coating layer of the first substrate is bonded to the adhesive layer of the second substrate to form a laminate structure of the first substrate, the abrasive material coating layer, the adhesive layer, and the second substrate in this order; and
   (4) separating the first substrate from the laminate formed in step (3), to obtain an abrasive sheet comprising the second substrate, the adhesive layer, and the abrasive material coating layer, said abrasive material coating layer having an embossed surface.

2. The method of claim 1, wherein the first substrate used in step (1) is obtained by coating a resin for release on the concave face of a paper, a polyethylene terephthalate film, a polypropylene film, or a polyethylene film which has at least one embossing shape.

3. The method of claim 2, wherein the embossing shape is the form of a cone, a triangular pyramid, a quadrangular pyramid, a hemi-cone, a dome, a serge, or a combination thereof, and has a dimension of an inner diameter and a height of 50~1,000 μm and 100~500 μm, respectively.

4. The method of claim 1, wherein the abrasive material-containing slurry used in step (1) has a viscosity at a temperature of 25±2° C. of 500 to 10,000 cps and a solid content of 40 to 85% by weight.

5. The method of claim 1, wherein the abrasive material-containing slurry used in step (1) comprise an adhesive selected from the group consisting of a phenol resin, a urea melamine resin, a urethane resin, an epoxy resin, a polyester acrylate resin, a latex, a water-soluble protein-based adhesive, and a mixture thereof.

6. The method of claim 1, wherein the amount of the abrasive material-containing slurry used in step (1) in coating the concave face of the first substrate is in the range of 25 to 130 g/m$^2$.

7. The method of claim 1, wherein the pre-drying in step (1) is conducted by heat-treating the coating layer at 100 to 120° C. for 1 to 5 minutes.

8. The method of claim 1, wherein the second substrate used in step (2) is a cloth, paper, a film, a sponge, a loop fabric, a non-woven fabric, an aluminum foil, or a combination thereof.

9. The method of claim 1, wherein the adhesive used in step (2) is selected from the group consisting of a polyurethane resin, an epoxy resin, an acrylonitrile-butadiene-rubber latex, a styrene-butadiene-rubber latex, a chloroprene-rubber latex, neoprene, a self-cross-linking pressure sensitive adhesive acryl rubber and a mixture thereof.

10. The method of claim 9, wherein the adhesive has a viscosity at a temperature of 25±2° C. of 500 to 10,000 cps.

11. The method of claim 1, wherein the amount of the adhesive used in coating one side of the second substrate is in the range of 20 to 60 g/m$^2$.

12. The method of claim 1, which further comprises curing the abrasive sheet obtained in step (4).

13. The abrasive sheet of a laminated form prepared by the method of claim 1.

14. The method of claim 12, wherein the curing of the abrasive sheet obtained in step (4) is conducted by heat-treating at 110 to 130° C. for 60 to 180 minutes or by UV-treating.

15. The method of claim 1, wherein the abrasive material contained in the slurry is abrasive particles having an average size of 0.5-150 μm.

* * * * *